(12) United States Patent
Hunkeler

(10) Patent No.: US 7,118,646 B2
(45) Date of Patent: Oct. 10, 2006

(54) METHOD OF MANUFACTURING A SEALED ELECTRONIC MODULE

(75) Inventor: Hugh R. Hunkeler, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 198 days.

(21) Appl. No.: 10/800,959

(22) Filed: Mar. 15, 2004

(65) Prior Publication Data

US 2005/0200045 A1    Sep. 15, 2005

(51) Int. Cl.
*B32B 37/00* (2006.01)
*H01G 1/02* (2006.01)
*H01F 15/02* (2006.01)
*H01L 21/54* (2006.01)
*H01I 23/18* (2006.01)

(52) U.S. Cl. .................. 156/293; 439/76.1; 439/396; 361/679; 361/736

(58) Field of Classification Search ............. None
See application file for complete search history.

(56) References Cited

U.S. PATENT DOCUMENTS 5,392,510 A * 2/1995 Chapman ............... 29/837
6,222,122 B1 * 4/2001 Davidson ............... 174/52.4

* cited by examiner

*Primary Examiner*—Justin Fischer
(74) *Attorney, Agent, or Firm*—Jimmy L. Funke

(57) ABSTRACT

A sealed electronic module is manufactured by forming a housing that is open at one end, dispensing a first quantity of potting material into the housing via the open end, inserting a circuit board and electrical connector assembly into the housing so that the inboard end of the circuit board is immersed in the potting material, and dispensing a second quantity of potting material into an area bridging the connector assembly and the housing. When cured, the first quantity of potting material attaches the inboard end of the circuit board to the housing, and the second quantity of potting material attaches the connector to the housing and environmentally seals the module.

8 Claims, 2 Drawing Sheets

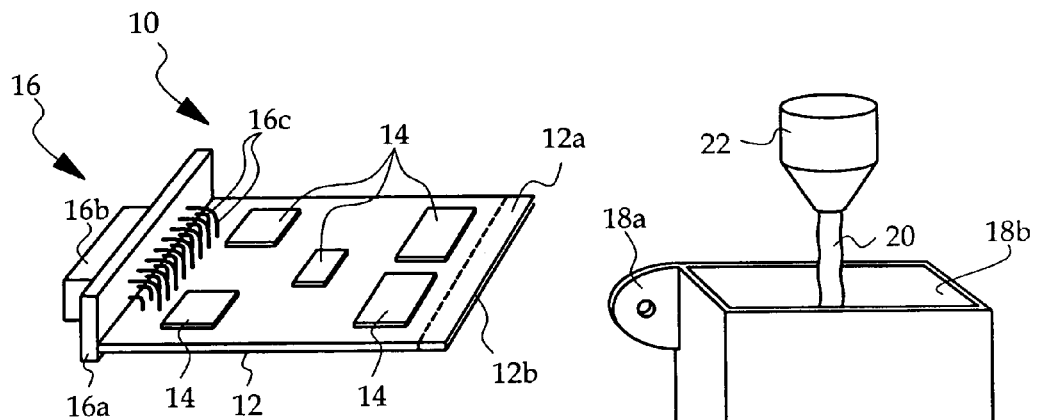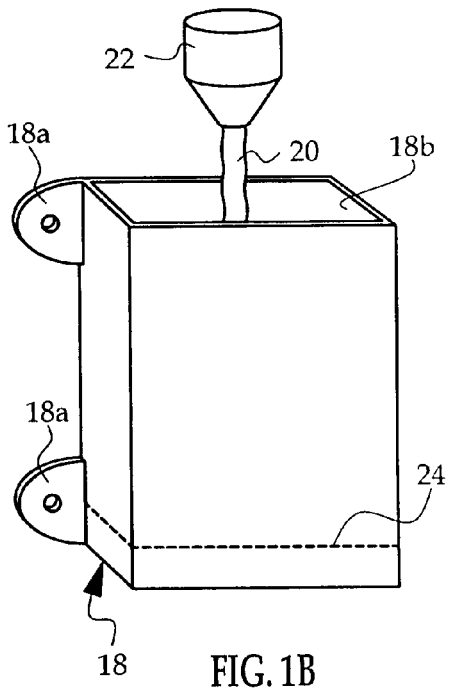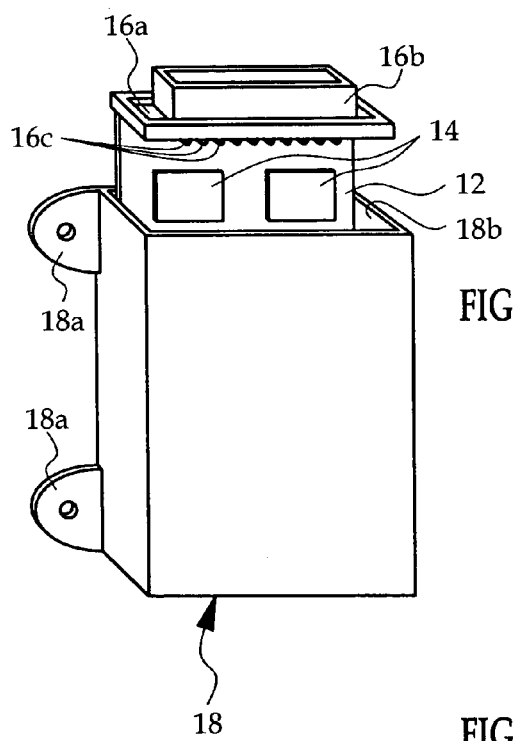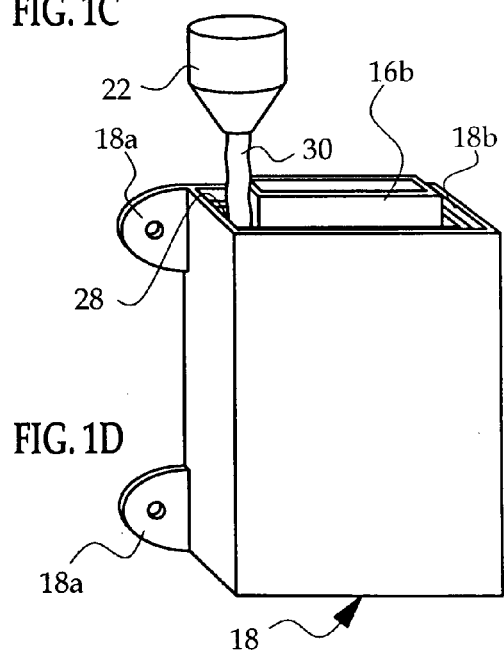
FIG. 1A
FIG. 1B
FIG. 1C
FIG. 1D

METHOD OF MANUFACTURING A SEALED ELECTRONIC MODULE

TECHNICAL FIELD

The present invention relates to the manufacture of a sealed electronic module including a circuit board/connector assembly and a housing open at one end.

BACKGROUND OF THE INVENTION

In the manufacture of electronic modules, various electronic components are mounted on a printed circuit board, connector terminals are soldered to a marginal portion of the circuit board, and the assembly is packaged in a plastic or metal housing. Usually, some provision is made for affixing the circuit board to the inner periphery of the housing, and the housing closes around the circuit board, with the connector pins protruding through the housing to enable electrical signal transmission to and from the module. In applications where the module has to be environmentally sealed, it is desirable to minimize the length and number of sealing surfaces. Theoretically, the sealing surfaces can be minimized by forming the housing as a single part with one opening through which the circuit board/connector assembly is inserted, but such an approach makes it difficult to attach the circuit board to the inner periphery of the housing since the interior of the housing is inaccessible after insertion of the circuit board/connector assembly. Alternatively, the entire housing may be filled with a potting material such as epoxy, but that is undesirable for several reasons, including cost, weight and the inadvisability of coating certain electronic components with potting material. Accordingly, what is needed is an improved method of manufacturing a sealed electronic module where the enclosed circuit board is securely attached to the inner periphery of the housing.

SUMMARY OF THE INVENTION

The present invention is directed to the manufacture of an electronic module including a circuit board/connector assembly and a housing that is open at one end, where potting material is used to mechanically secure the circuit board to the housing and to provide an environmental seal at the open end of the housing. The empty housing is positioned so that its open end is facing upward, and a first quantity of potting material is dispensed into the housing. The circuit board/connector assembly is then inserted into the housing, immersing the inboard end of the circuit board into the potting material. The connector includes a cover that conforms to the inner periphery of the housing, forming an annular pocket at the open end of the housing, and a second quantity of potting material is then dispensed into the annular pocket. When cured, the first quantity of potting material attaches the inboard end of the circuit board to the inner periphery of the housing, and the second quantity of potting material attaches the connector to the housing and environmentally seals the module.

BRIEF DESCRIPTION OF THE DRAWINGS

The present invention will now be described, by way of example, with reference to the accompanying drawings, in which:

FIGS. 1A–1D illustrate the manufacturing method of this invention. FIG. 1A depicts a circuit board/connector assembly, FIG. 1B depicts a step of dispensing a first quantity of potting material into the open end of a housing; FIG. 1C depicts insertion of the circuit board/connector assembly of FIG. 1A into the housing of FIG. 1B; and FIG. 1D depicts a step of dispensing a second quantity of potting material into a pocket formed at the open end of the housing.

DESCRIPTION OF THE PREFERRED EMBODIMENT

Figure 2:
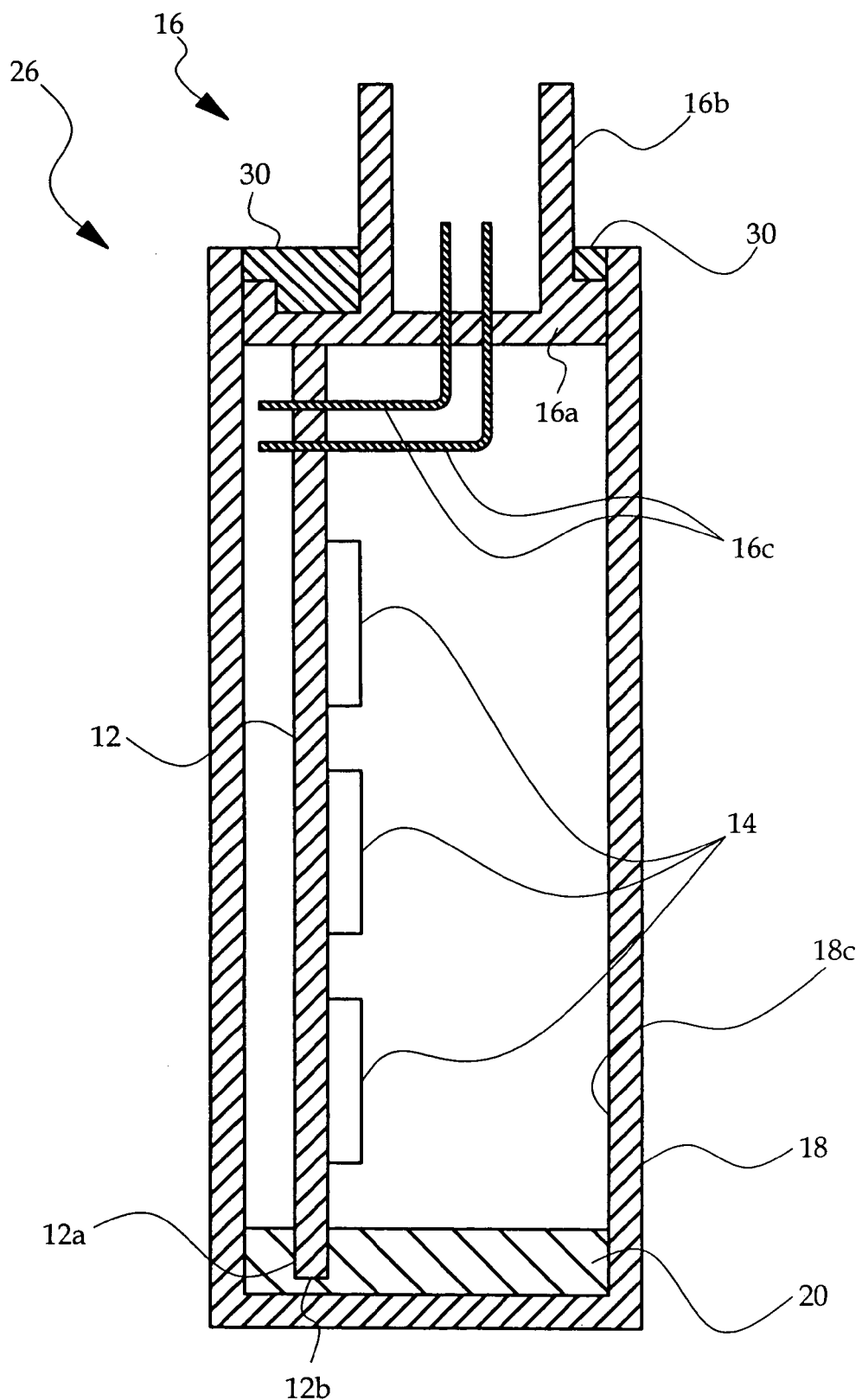
FIG. 2 is a cross-sectional view of an electronic module manufactured according to this invention.

The manufacturing method of the present invention is disclosed in the context of an automotive electronic module such as a Sensing and Diagnostic Module (SDM) for deploying supplemental restraints in a severe crash event. In such an application, the enclosed circuit components 14 include acceleration-responsive sensors, and the circuit board 12 has to be securely attached to the inner periphery of the housing 18 to ensure that the sensors operate correctly. Of course, similar requirements occur in other applications as well, and the manufacturing method applies to sealed electronic modules per se, whether automotive or non-automotive.

Referring to FIG. 1A, the reference numeral 10 generally designates a circuit board/connector assembly, including a printed circuit board 12 supporting a number of electronic components 14, and a connector assembly 16. The connector assembly 16 is attached to the outboard end of the circuit board 12, and the components 14 may be distributed on the circuit board 12 in any convenient manner, except for a marginal portion 12a that includes the inboard end 12b of circuit board 12. The connector assembly 16 includes a plastic base plate 16a, a plastic header box 16b, and a number of metal connector pins 16c passing through the base plate 16a. The connector assembly 16 is preferably manufactured by an insert molding process so that the material of base plate 16a seals around the connector pins 16c. The leftward extending (outboard) ends of the pins 16c are disposed within the header box 16b (as seen in the cross-sectional view of FIG. 2) for attachment to a complementary electrical connector (not shown); and the rightward extending (inboard) ends of the pins 16c are bent toward the circuit board 12 for attachment thereto. Typically, the pins 16c extend through plated openings formed in the circuit board 12, and are soldered in place to both electrically and mechanically connect the circuit board 12 to the connector assembly 16.

In FIGS. 1B, 1C and 1D, the reference numeral 18 generally designates a housing for enclosing the circuit board/connector assembly 10. The housing 18 is preferably formed of plastic, and includes integral mounting tabs 18a for securing the completed electronic module to a support structure such as a vehicle frame element. The housing 18 is closed on all sides and one end, and is oriented so that the open end 18b is pointed upward as shown. The housing 18 is dimensioned so as to freely receive the circuit board/connector assembly 10 of FIG. 1A, with the inner periphery of the housing generally conforming to the circumferential periphery of the connector assembly base plate 16a.

As shown in FIG. 1B, a dispensing nozzle 22 is positioned over the open end 18b of housing 18, and first quantity of potting material 20 is dispensed into bottom of housing 18. The potting material 20 fills the interior volume of housing 18 to a level such as shown by the broken line 24. The circuit board/connector assembly 10 is then inserted into the housing 18 as illustrated in FIG. 1C before the potting material 20 cures and hardens, immersing the marginal portion 12a of circuit board 12 into the potting material 20. This may be best seen in FIG. 2, which depicts a completed electronic module 26. As also shown in FIG. 2, the portion of the circuit board 12 on which the components 14 are mounted is not immersed in the potting material 20; this is important as it is inadvisable to coat certain electronic components with potting material.

When the circuit board/connector assembly 10 has been fully inserted into the housing 18, there is an annular pocket or cavity 28 through which the connector assembly header box 16b extends. Referring to FIGS. 1D and 2, the cavity 28 is defined by the connector assembly base plate 16a and header box 16b and the inner periphery of the housing 18 above the base plate 16a. At this point, the dispensing nozzle 22 is positioned over the cavity 28 as illustrated in FIG. 1D, and a second quantity of potting material 30 is dispensed into the cavity 28, preferably filling the cavity volume as depicted in FIG. 2.

The last step of the process is to allow undisturbed curing of the first and second quantities of potting material 20, 30 so that the potting material hardens substantially where dispensed. Referring to FIG. 2, the first quantity of potting material 20 then effectively attaches the marginal portion 12a of the circuit board 12 to the inner periphery 18c of the housing 18, and the second quantity of potting material 30 forms a seal between the connector assembly 16 and the inner periphery 18c of the housing 18, environmentally sealing the module 26. The potting material 20 may be of the same formulation as the potting material 30, or a different formulation if desired. In any case, the potting material 20, 30 may be any commercially available potting (epoxy, for example) that has an initial free-flowing state, and that chemically cures to a hardened state.

In summary, the manufacturing method of the present invention results in a reliably sealed electronic module 26 where potting material is used both to seal the housing 18 and to secure an enclosed circuit board 12 to the inner periphery 18c of housing 18. Only a small overall amount of potting material is required, which contributes to low cost and low weight of the module 26. Also, the potting material 20 only comes into contact with the marginal portion 12a of the circuit board 12, and does not come into contact with the electrical components 14 mounted elsewhere on the circuit board 12.

While the method of the present invention has been described in reference to the illustrated embodiment, it will be recognized that various modifications will occur to those skilled in the art. For example, the housing 18 may have a shape other than rectangular, and so on. Accordingly, it will be understood that manufacturing methods incorporating these and other modifications may fall within the scope of this invention, which is defined by the appended claims.

The invention claimed is:

1. A method of manufacturing a sealed module that houses a circuit board supporting one more electronic components, the method comprising the steps of:
   mechanically and electrically attaching an electrical connector to a first end of the circuit board;
   providing a housing open at only one end, said housing having an inner periphery shaped to accommodate said circuit board and said electrical connector with the electrical connecter being shaped and sized to close the open end of the housing while retaining the circuit board entirely within in the housing;
   orienting said housing with said one end facing upward, and dispensing a first quantity of potting material into said housing through said one end;
   inserting said circuit board and attached electrical connector into the one end of said housing such that only a marginal portion of said circuit board including a second end of said circuit board opposite said first end is immersed into said first quantity of potting material;
   sealing said electrical connector to the inner periphery of said housing; and
   curing said first quantity of potting material to secure said circuit board to the inner periphery of said housing.

2. The method of claim 1, where said marginal portion of said circuit board is free of said electronic components so that said first quantity of potting material does not come into contact with said components.

3. A method of manufacturing a sealed module that houses a circuit board supporting one more electronic components, the method comprising the steps of:
   mechanically and electrically attaching an electrical connector to a first end of the circuit board;
   providing a housing open at only one end, said housing having an inner periphery shaped to accommodate said circuit board and said electrical connector;
   orienting said housing with said one end facing upward, and dispensing a first quantity of potting material into said housing through said one end;
   inserting said circuit board and attached electrical connector into the one end of said housing such that only a marginal portion of said circuit board including a second end of said circuit board opposite said first end is immersed into said first quantity of potting material;
   sealing said electrical connector to the inner periphery of said housing;
   curing said first quantity of potting material to secure said circuit board to the inner periphery of said housing;
   dispensing a second quantity of potting material onto an outboard surface of said connector; and
   curing said second quantity of potting material to seal said electrical connector to the inner periphery of said housing.

4. The method of claim 3, including the steps of:
   providing a base plate on said electrical connector that conforms to the inner periphery of said housing so as to create a pocket defined by said base plate and the inner periphery of said housing when said circuit board and attached electrical connector are inserted into the one end of said housing; and
   dispensing said second quantity of potting material into said pocket.

5. The method of claim 3, wherein the step of inserting said circuit board and attached electrical connector further comprises orienting the inserted circuit board substantially downwardly from the connector so that it is retained in an attitude substantially normal to the electrical connector that closes the open end of the housing.

6. The method of claim 1, wherein the step of inserting said circuit board and attached electrical connector further comprises orienting the inserted circuit board substantially downwardly from the connector so that it is retained in an attitude substantially normal to the electrical connector that closes the open end of the housing.

7. A method of manufacturing a sealed module that houses a circuit board supporting one more electronic components, the method comprising the steps of:
   mechanically and electrically attaching an electrical connector to a first end of the circuit board;
   providing a housing open at only one end, said housing comprising a first housing member having an inner periphery shaped to accommodate said circuit board and said electrical connector;

orienting said housing with said one end facing upward, and dispensing a first quantity of potting material into said housing through said one end;

inserting said circuit board and attached electrical connector into the one end of said housing such that only a marginal portion of said circuit board including a second end of said circuit board opposite said first end is immersed into said first quantity of potting material, the electrical connector comprising a second housing member that completes the housing;

sealing said electrical connector to the inner periphery of said housing; and curing said first quantity of potting material to secure said circuit board to the inner periphery of said housing.

8. The method of claim 6, wherein the step of inserting said circuit board and attached electrical connector further comprises orienting the inserted circuit board substantially downwardly from the connector so that it is retained in an attitude substantially normal to the electrical connector that closes the open end of the housing.

* * * * *